(12) United States Patent
Sohn et al.

(10) Patent No.: US 8,122,188 B2
(45) Date of Patent: Feb. 21, 2012

(54) METHOD OF CONTROLLING REFRESH OPERATION IN MULTI-PORT DRAM AND A MEMORY SYSTEM USING THE METHOD

(75) Inventors: Han-Gu Sohn, Gyeonggi-do (KR); Sei-Jin Kim, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 404 days.

(21) Appl. No.: 11/459,895

(22) Filed: Jul. 25, 2006

(65) Prior Publication Data
US 2007/0022245 A1    Jan. 25, 2007

(30) Foreign Application Priority Data
Jul. 25, 2005 (KR) .................. 10-2005-0067290

(51) Int. Cl.
*G06F 12/00* (2006.01)
*G06F 13/00* (2006.01)
*G06F 13/28* (2006.01)

(52) U.S. Cl. ........................ 711/106; 365/222
(58) Field of Classification Search .................. 711/106; 365/222
See application file for complete search history.

(56) References Cited

U.S. PATENT DOCUMENTS

| | | | | |
|---|---|---|---|---|
| 4,276,594 | A * | 6/1981 | Morley | 713/600 |
| 4,317,169 | A * | 2/1982 | Panepinto et al. | 711/106 |
| 5,928,365 | A * | 7/1999 | Yoshida | 713/324 |
| 6,389,497 | B1 * | 5/2002 | Koslawsky et al. | 710/242 |
| 2002/0078311 | A1 * | 6/2002 | Matsuzaki et al. | 711/149 |
| 2002/0169908 | A1 * | 11/2002 | Shiraga | 710/240 |

FOREIGN PATENT DOCUMENTS

| | | |
|---|---|---|
| JP | 52-3347 | 1/1997 |
| JP | 10-11964 | 1/1998 |

OTHER PUBLICATIONS

English language abstract of Korean Publication No. 2002-0018071.
English language abstract of Korean Publication No. 2005-0013701.
English language abstract of Japanese Publication No. 2001-118383.
Office Action issued in Japanese Patent Application No. 2006-202506 on Nov. 22, 2011.

* cited by examiner

*Primary Examiner* — Stephen Elmore
*Assistant Examiner* — Mark Giardino, Jr.
(74) *Attorney, Agent, or Firm* — Stanzione & Kim, LLP

(57) ABSTRACT

A multi-port memory system includes a shared memory bank, and a refresh controller coupled to the shared memory bank, and configured to selectively apply refresh commands from multiple processors to the shared memory bank.

12 Claims, 5 Drawing Sheets

METHOD OF CONTROLLING REFRESH OPERATION IN MULTI-PORT DRAM AND A MEMORY SYSTEM USING THE METHOD

CROSS-REFERENCE TO RELATED PATENT APPLICATION

This application claims the benefit of Korean Patent Application No. 10-2005-0067290, filed on 25 Jul. 2005, in the Korean Intellectual Property Office, the disclosure of which is incorporated herein in its entirety by reference.

BACKGROUND

1. Technical Field

This disclosure relates to a semiconductor memory device, and more particularly, to a method of controlling refresh operation in multi port dynamic random access memory (DRAM) and a memory system using the method.

2. Description of the Related Art

DRAM devices have been widely used because of their high integration density and high operating speed. A DRAM cell includes a transistor and a capacitor. A considerable number of such DRAM cells can be integrated into a single DRAM device. DRAM cells are smaller than other memory cells such as static random access memory (SRAM) cells.

Due to leakage current, however, the electrical charge of DRAM cells decreases over time after the DRAM cells are charged. As a result, DRAM cells need to be periodically refreshed. Specifically, data stored in the capacitors of the DRAM cells need to be refreshed periodically.

There are two methods of refreshing DRAMs: an auto-refresh method and a self-refresh method. In the auto-refresh method, a predetermined time period is allocated within a normal operating period of a DRAM during which a refresh operation is automatically performed. In the self-refresh method, a refresh operation is performed when a DRAM is in a standby mode. The auto-refresh method and the self-refresh method are obvious to one of ordinary skill in the art to which semiconductor memory devices pertain.

Dual-port RAMs are memories having two input/output ports. Specifically, dual-port RAMs have one input/output port for allowing access to the dual-port RAMs by associated processors and one input/output port for allowing access to the dual-port RAMs by external processors via buses. Thus, data stored in a dual-port DRAM can be accessed via 2 ports.

Dual-port RAMs may be classified into dual-port DRAMs having DRAM cells as unit memory cells and dual-port SRAMs having SRAM cells as unit memory cells. In dual-port SRAMs, each of the unit memory cells, which can store 1-bit data, includes 4 transistors forming a latch structure and 2 transistors forming a transmission gate. In typical SRAMs, data is stored in each unit memory cell using the latch structure, and thus, there is no need to perform a refresh operation to preserve the data. However, since an SRAM cell includes 6 transistors, it occupies a larger area than a DRAM cell with 1 transistor and 1 capacitor.

Dual-port DRAMs, unlike dual-port SRAMs, need to have their unit memory cells refreshed periodically.

FIG. 1 is a block diagram of a conventional dual-port DRAM 10 which can be accessed by 2 processors. Referring to FIG. 1, the dual-port DRAM 10 includes 4 memory banks A, B, C, and D. A first processor 12 can access the memory banks A, B, and C, and a second processor 14 can access the memory banks C and D.

The memory bank C is shared by the first and second processors 12 and 14. Thus, the memory cells in the memory bank C can be refreshed independently by the first and second processors 12 and 14.

An auto-refresh command is prioritized above all other commands, and is thus applied to a DRAM ahead of the other commands. However, if the second processor 14 issues a refresh command while a refresh operation is performed in response to a refresh command issued by the first processor 12, the refresh command issued by the second processor 14 may not be executed until the refresh operation performed in response to the refresh command issued by the first processor 12 is complete. In this case, even if the second processor 14 issues another command, it cannot be executed until the refresh command issued by the second processor 14 is executed.

In addition, if a refresh command is issued by the second processor 14 after the refresh operation performed in response to the refresh command issued by the first processor 12 is complete, the power consumption of the dual-port DRAM 10 undesirably increases due to the repetition of the auto-refresh operation.

SUMMARY

An embodiment includes a multi-port memory system including a shared memory bank, and a refresh controller coupled to the shared memory bank, and configured to selectively apply refresh commands from multiple processors to the shared memory bank.

Another embodiment includes a multi-port memory system including multiple processors, and a shared memory bank coupled to the processors. The shared memory bank is configured to receive a refresh command from only one of the processors.

Another embodiment includes a method of refreshing memory banks of a multi-port memory system including receiving a refresh command, and selectively applying the refresh command to a shared memory bank of the memory banks.

BRIEF DESCRIPTION OF THE DRAWINGS

The above and other features and advantages will become more apparent by describing embodiments in detail with reference to the attached drawings in which.

DETAILED DESCRIPTION

Figure 1:
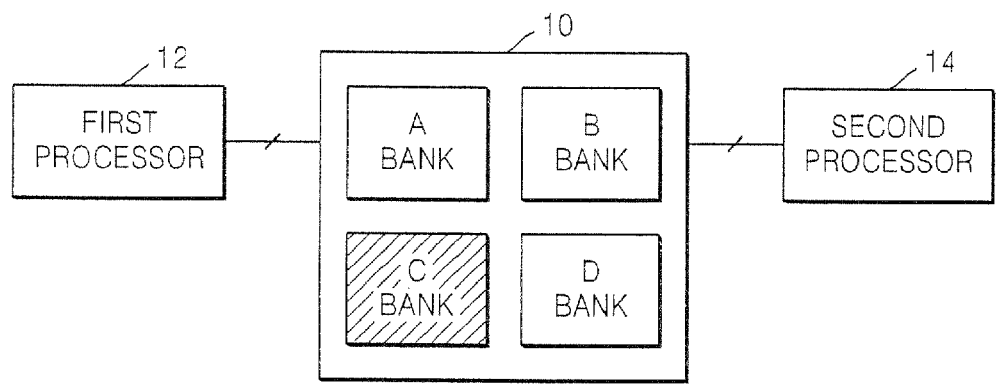
FIG. 1 is a block diagram of a conventional dual-port DRAM that can be accessed by 2 processors.

Embodiments will now be described more fully with reference to the accompanying drawings. In the drawings, like reference numerals represent like elements.

Figure 2:
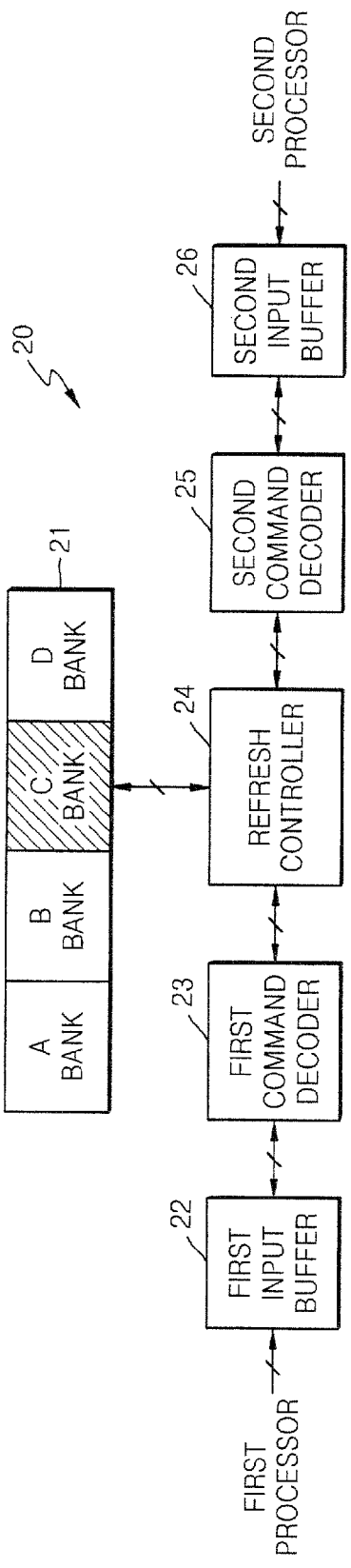
FIG. 2 is a block diagram of a multi-port memory system according to an embodiment.

FIG. 2 is a block diagram of a multi-port memory system 20 according to an embodiment. Referring to FIG. 2, the multi-port memory system 20 includes memory banks 21 (A, B, C, and D), each including multiple memory cells, a first input buffer 22, a first command decoder 23, a refresh controller 24, a second command decoder 25, and a second input buffer 26.

It is assumed that the memory bank C is shared by first and second processors (not shown). The first input buffer 22 is configured to receive a first command signal and first data from the first processor, and the first command decoder 23 is configured to decode the first command and data. The second input buffer 26 is configured to receive a second command signal and second data from the second processor, and the second command decoder 25 is configured to decode the second command and data.

The refresh controller 24 is configured to control first and second refresh commands output from the first and second command decoders 23 and 25, respectively, such that one of the first and second refresh commands can be executed and the other refresh command can be cancelled. For example, the refresh controller 24 may control the memory bank C to be refreshed in response to the first refresh command while cancelling the second refresh command.

The refresh controller 24 may control the memory banks A and B, which can only be accessed by the first processor, to be refreshed in response to the first refresh command and may control the memory bank D, which can only be accessed by the second processor, to be refreshed in response to the second refresh command.

As a result, delays in the multi-port memory system 20 are prevented and the multi-port memory system 20 is prevented from malfunctioning or consuming too much power due to a collision between multiple refresh commands by setting the multi-port memory system 20 such that shared memory banks in the multi-port memory system 20 can only be refreshed under the control of a predetermined processor.

Figure 3:
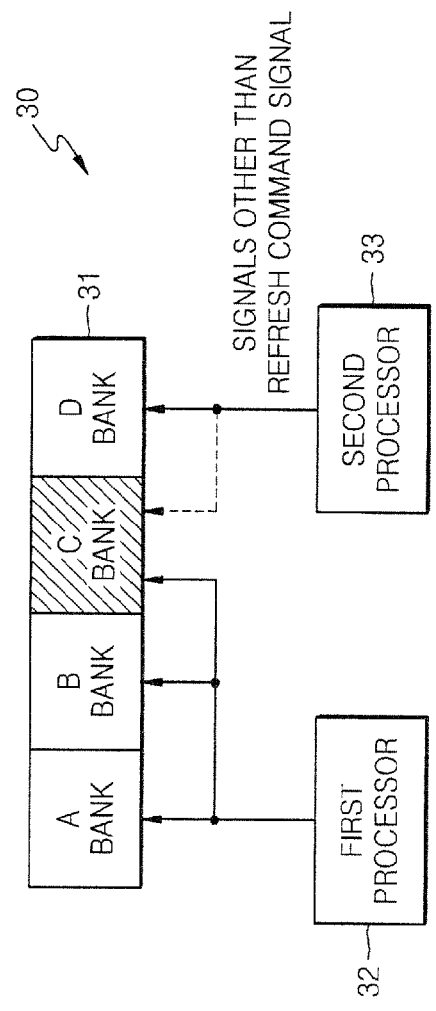
FIG. 3 is a block diagram of a multi-port memory system according to another embodiment.

FIG. 3 is a block diagram of a multi-port memory system 30 according to another embodiment. Referring to FIG. 3, the multi-port memory system 30 includes a plurality of memory banks 31 (A, B, C, and D). It is assumed that the memory banks A and B can only be accessed by a first processor 32, the memory bank D can only be accessed by a second processor 33, and the memory bank C is shared by the first and second processors 32 and 33.

The first and second processors 32 and 33 can access the memory bank C independently of each other. In other words, the first and second processors 32 and 33 can transmit/receive data and address signals to the memory bank C separately from each other and can also apply command signals to the memory bank C separately from each other. However, the multi-port memory system 30 is set such that only the first processor 32 can apply a refresh command signal for the memory bank C and the second processor 33 can be prevented from applying a refresh command signal for the memory bank C.

For example, the memory specification is set such that only one of the first and second processors 32 and 33 can apply a refresh command signal for shared memory banks.

Figure 4:
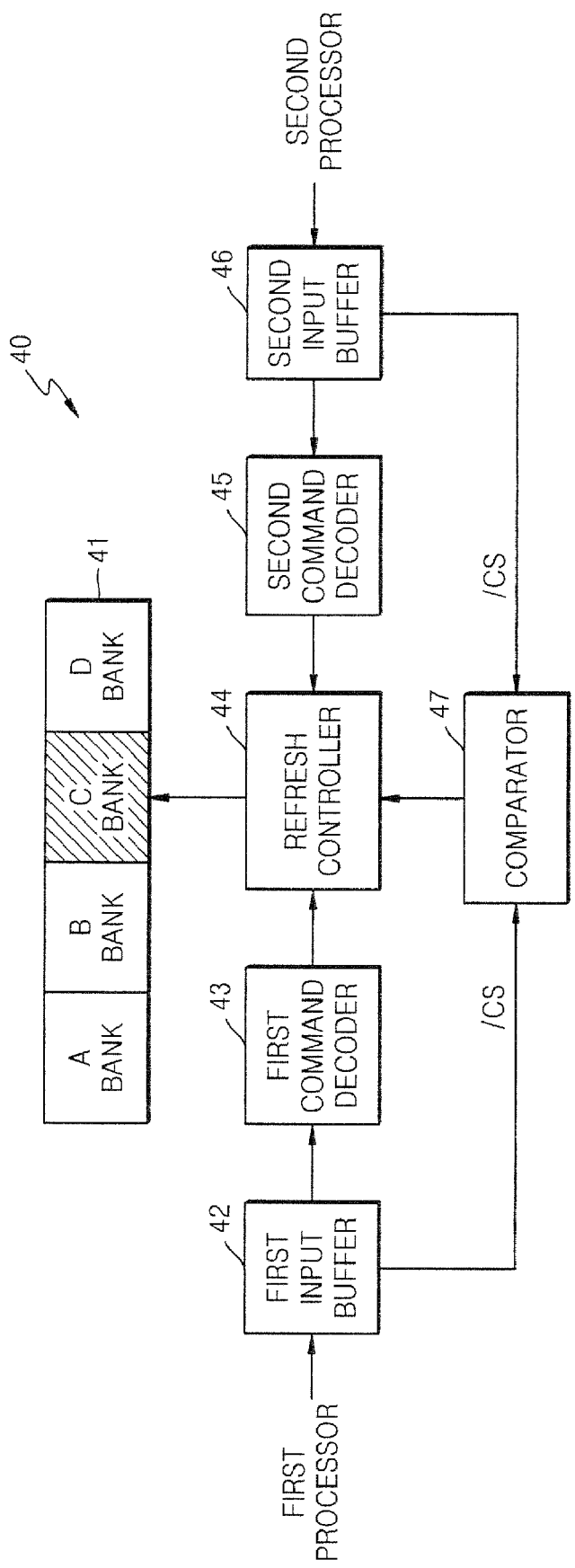
FIG. 4 is a block diagram of a multi-port memory system according to another embodiment.

FIG. 4 is a block diagram of a multi-port memory system 40 according to another embodiment. Referring to FIG. 4, the multi-port memory system 40 includes multiple memory banks 41 (A, B, C, and D), each including multiple memory cells, a first input buffer 42, a first command decoder 43, a refresh controller 44, a second command decoder 45, a second input buffer 46, and a comparator 47.

In this embodiment in the memory banks A, B, C, and D, only the memory bank C is shared by first and second processors. The first input buffer 42 is configured to receive a first command signal from the first processor and buffer the first command signal. The first command decoder 43 is configured to decode the buffered first command signal received from the first input buffer 42. The second input buffer 46 is configured to receive a second command signal from the second processor and buffer the second command signal. The second command decoder 45 is configured to decode the buffered second command signal received from the second input buffer 46. The comparator 47 is configured to compare a first chip selection signal /CS received from the first input buffer 42 and a second chip selection signal /CS received from the second input buffer 46 with a mode register code, such as an extended mode register set (EMRS) code.

If the first chip selection signal /CS matches the EMRS code, the comparator is configured to output a first comparison result signal to the refresh controller 44, and the refresh controller 44 is configured to control a refresh operation in response to the first comparison result signal to be performed only in response to a first refresh command output from the first command decoder 43. On the other hand, if the second chip selection signal /CS matches the EMRS code, the comparator 47 is configured to output a second comparison result signal to the refresh controller 44, and the refresh controller 44 controls a refresh operation in response to the second comparison result signal to be performed only in response to a second refresh command output from the second command decoder 45.

In this embodiment, the memory bank C can be refreshed in response to a refresh command issued by one of the first and second processors specified by the EMRS code. The refresh controller 44 controls the memory banks A and B, which can only be accessed by the first processor, to be refreshed in response to the first refresh command output from the first command decoder 43 and controls the memory bank D, which can only be accessed by the second processor, to be refreshed in response to the second refresh command output from the second command decoder 45.

Although a mode register code has been described as part of the decision of issuing a refresh command, other configurations of circuitry may be used to affect the decision. For example, fuses may be selectively cut to set a code for the decision of issuing the refresh command. Alternatively, an externally generated signal may be used. Any configurable circuitry of the multi-port memory system may be used.

Figure 5:
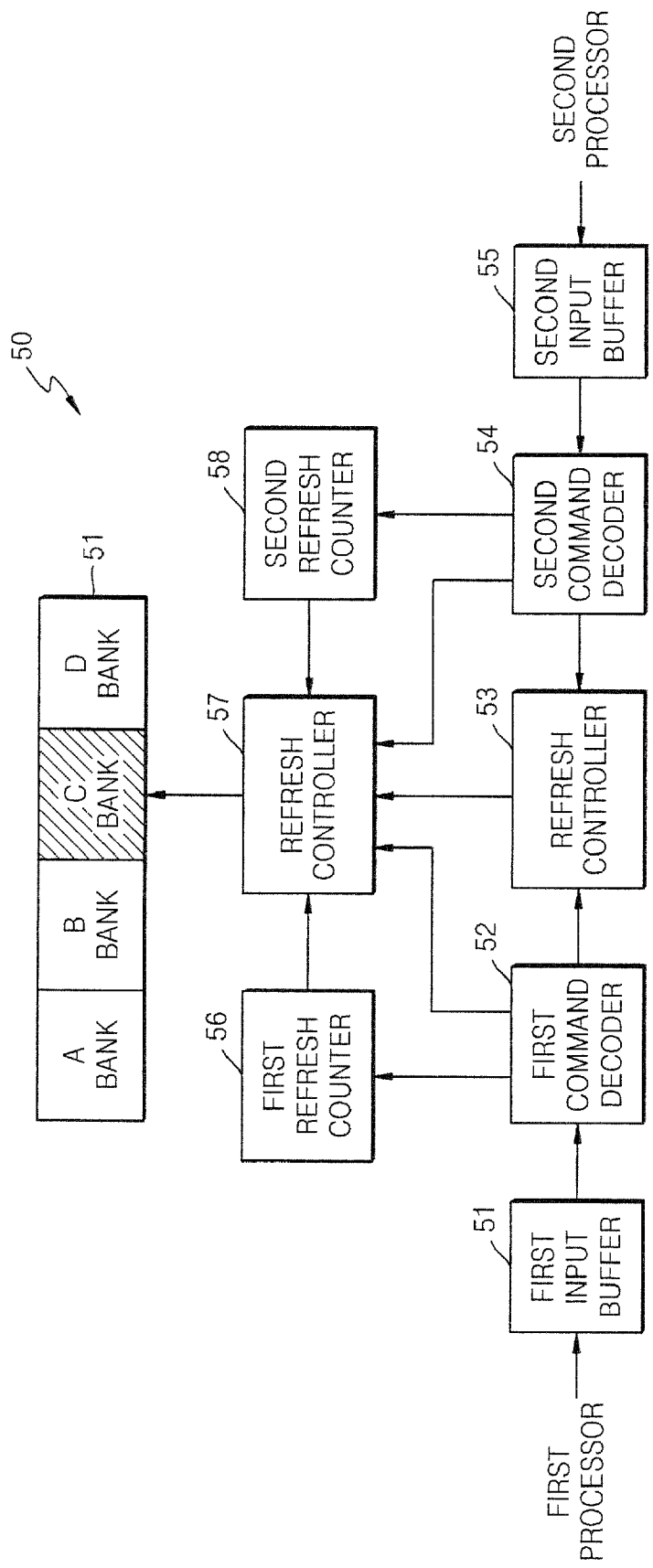
FIG. 5 is a block diagram of a multi-port memory system according to another embodiment.

FIG. 5 is a block diagram of a multi-port memory system 50 according to another embodiment. Referring to FIG. 5, the multi-port memory system 50 includes multiple memory banks 59 (A, B, C and D), a first input buffer 51, a first command decoder 52, a refresh flag generator 53, a second command decoder 54, a second input buffer 55, a first refresh counter 56, a refresh controller 57, and a second refresh counter 58.

In this embodiment, the memory banks A and B can only be accessed by a first processor, the memory bank C is shared by the first processor and a second processor, and the memory bank D can only be accessed by the second processor.

The first input buffer 51 is configured to receive a first command signal from the first processor and buffer the first command signal. The first command decoder 52 is configured to decode the buffered first command signal received from the first input buffer 51. The second input buffer 55 is configured to receive a second command signal from the second processor and buffer the second command signal. The second command decoder 54 is configured to decode the buffered second command signal received from the second input buffer 55. The refresh flag generator 53 is configured to generate a refresh flag having a logic high level and output the refresh flag to the refresh controller 57 when receiving the first or second refresh command signal from the first or second command decoder 52 or 54.

The first refresh counter 56 is configured to count addresses refreshed in response to a first refresh command output from the first command decoder 52. The second refresh counter 58 is configured to count addresses refreshed in response to a second refresh command output from the second command decoder 54.

The refresh controller 57 is configured to execute whichever of the first and second refresh commands is applied to the earliest and cancel the other refresh command, thereby performing an auto-refresh operation on the memory bank C, which is shared by the first and second processors.

For example, the refresh controller 57 may cancel a refresh command currently being applied if the memory bank C is currently being refreshed in response to a refresh command that was previously input to the refresh controller 57. In this case, the refresh controller 57 may determine whether the memory bank C is currently being refreshed by determining whether the refresh flag generator 53 outputs a flag having a logic high level.

When one of the first and second refresh commands is input, the refresh controller 57 can determine whether the refreshing of the memory bank C in response to a refresh command that was previously input is complete. If the refreshing of the memory bank C in response to the previously input refresh command is complete, the refresh controller 57 can cancel the current refresh command. In this case, the refresh controller 57 can determine whether the refreshing of the memory bank C in response to the previously input refresh command is complete by comparing a first refresh address counter value output from the first refresh counter 56 with a second refresh address counter value output from the second refresh counter 58.

If a refresh command issued by each of the first and second processors is a periodic refresh command, the first and second refresh counter values may have a difference of 1 when the execution of a refresh command issued by one of the first and second processors is complete and then another refresh command is issued by the other processor. In addition, if a refresh command issued by each of the first and second processors is a burst refresh command, the first and second refresh address counter values may have a difference of more than 1 when the execution of a refresh command issued by one of the first and second processors is complete and then another refresh command is issued by the other processor. Furthermore, if one of the first and second processors issues a periodic refresh command and the other processor issues a burst refresh command, the first and second refresh address counter values may have a difference of more than 1 when the execution of a refresh command issued by one of the first and second processors is complete and then another refresh command is issued by the other processor.

Therefore, the refresh controller 57 may execute a refresh command currently being applied thereto if the first and second refresh address counter values are equal and may cancel the current refresh command if the first and second refresh addresses have a difference of 1 or more.

Figure 6:
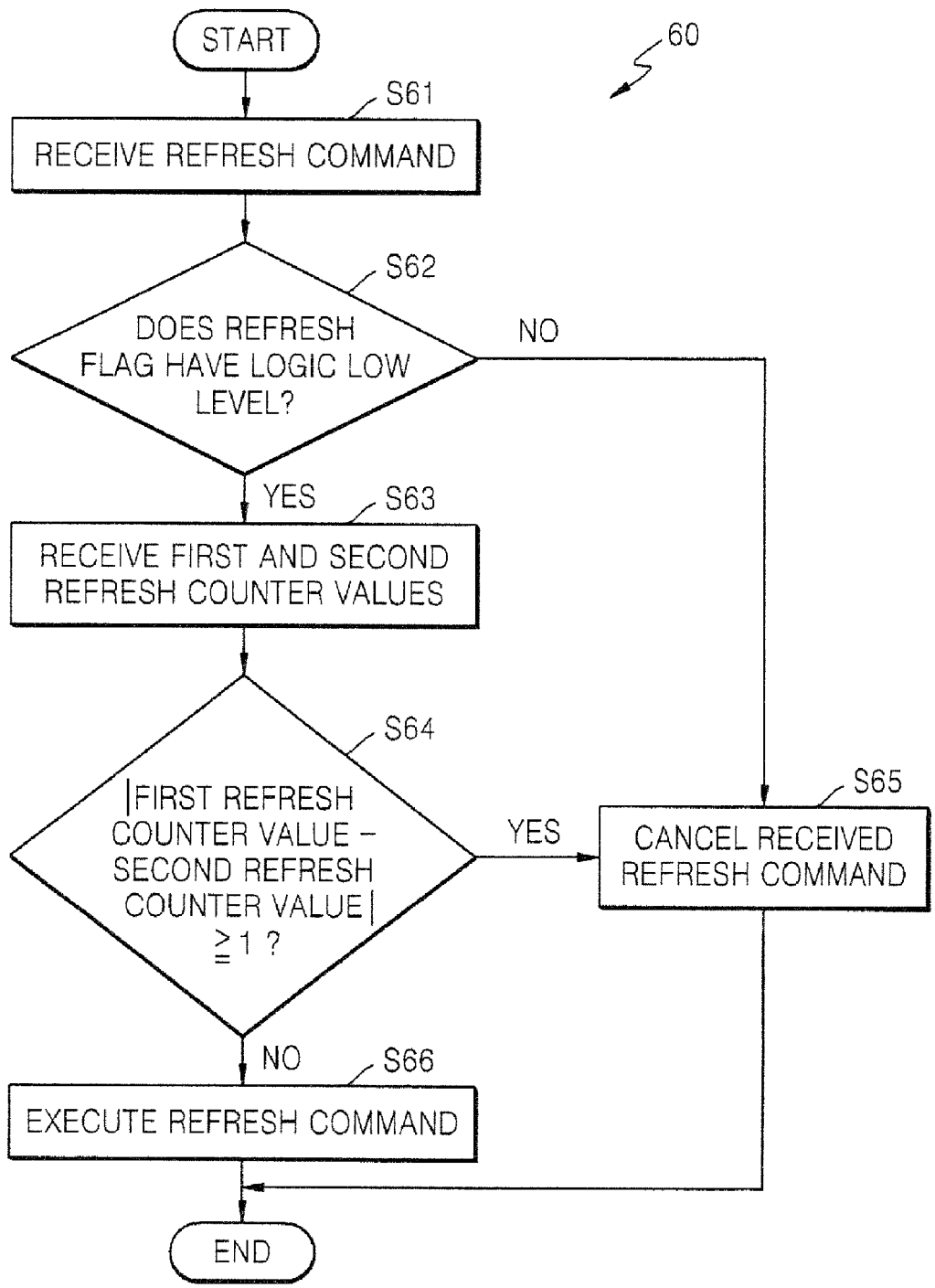
FIG. 6 is a flowchart illustrating a refresh method performed by the multi-port memory system of FIG. 5, according to an embodiment.

FIG. 6 is a flowchart illustrating an embodiment of a refresh method performed by the multi-port memory system 50 of FIG. 5. Referring to FIGS. 5 and 6, in operation S61, a refresh command is received. In operation S62, the refresh controller 57 examines a refresh flag. In operation S65, if the refresh flag has a logic high level, the refresh controller 57 cancels the received refresh command. In operation S63, if the refresh flag has a logic low level, the refresh controller 57 receives a first refresh address counter value and a second refresh address counter value from the first refresh counter 56 and the second refresh counter 58, respectively. In operation S64, the refresh controller 57 compares the first refresh address counter value with the second refresh address counter value. In operation S66, if the first and second refresh address counter values are equal, the refresh controller 57 executes the received refresh command. In operation S65, if the first and second refresh address counter values have a difference of 1 or more, the refresh controller 57 cancels the received refresh command.

In this embodiment, the first and second processors of the multi-port memory system 50 can execute a refresh command for a shared memory bank separately from each other. The refresh controller 57 can prevent delays in the multi-port memory system 50 and prevent the multi-port memory system 50 from malfunctioning due to a collision between 2 refresh commands respectively issued by the first and second processors by executing whichever of the 2 refresh commands applied to the refresh controller 57 earliest and cancelling the other refresh command. In addition, the refresh controller 57 can prevent the multi-port memory system 50 from consuming too much power while performing a refresh operation repeatedly.

According to an embodiment, it is possible to prevent refresh commands issued by different processors from colliding with each other. Therefore, it is possible to prevent a multi-port memory system from malfunctioning and consuming too much power because of refresh control commands issued by different processors.

Although refresh operations, commands, and the like have been described in reference to two processors, more than two processors may be used. In addition, although two ports have been described, more than two ports may be used. For example, four processors may access the memory system through three ports, with two of the processors accessing the memory system through a single port.

Furthermore, although one shared memory bank has been described, the memory system may include more than one shared memory bank. In addition, the refresh operations for the shared memory banks may be controlled through one refresh controller or multiple refresh controllers, with each refresh controller controlling the refresh of one or more shared memory banks.

While embodiments are particularly shown and described with reference to the drawings, it will be understood by those of ordinary skill in the art that various changes in form and details may be made without departing from the spirit and scope as defined by the following claims.

What is claimed is:

1. A multi-port memory system comprising:
a plurality of input buffers, each input buffer configured to receive command signals from a corresponding processor;
a plurality of command decoders, each command decoder coupled to a corresponding input buffer and configured to decode a refresh command from the command signals received by the corresponding input buffer and output the refresh command;
a shared memory bank;
a refresh controller coupled to the command decoders and configured to receive the refresh commands output from the command decoders and selectively apply the refresh commands to the shared memory bank; and a comparator coupled to the refresh controller and the input buffers, and configured to compare the plurality of command signals with a setting to generate a comparison result, wherein the refresh controller is configured to selectively apply a refresh command to the shared memory bank in response to the comparison result, and wherein the comparator is further configured to, for each command signal, compare a chip select signal of the command signal with a mode register code to generate the comparison result.

2. The multi-port memory system of claim 1, wherein the refresh controller is further configured to cancel a first refresh command.

3. The multi-port memory system of claim 1, wherein the refresh
controller is further configured to cancel a first refresh command while the refresh controller is processing a second refresh command.

4. The multi-port memory system of claim 1, wherein the refresh controller is configured to apply refresh commands only associated with a chip select signal matching the mode register code.

5. The multi-port memory system of claim 1, further comprising:
a refresh flag generator coupled to the refresh controller, and configured to generate a refresh flag indicating if a refresh operation is being performed on the shared memory bank; and
a plurality of refresh counters, each refresh counter coupled to the refresh controller, and configured to count addresses refreshed in response to an associated refresh command.

6. The multi-port memory system of claim 5, wherein the refresh controller is further configured to, while the refresh controller is processing a first refresh command, cancel a second refresh command in response to the refresh flag.

7. The multi-port memory system of claim 5, wherein the refresh controller is further configured to cancel a refresh command in response to a comparison of the counts of the refresh counters.

8. The multi-port memory system of claim 7, wherein the refresh controller is further configured to cancel a refresh command if the comparison of the counts of the refresh counters indicates that the counts of the refresh counters are not equal.

9. The multi-port memory system of claim 1, further comprising:
a plurality of private memory banks, each private memory bank associated with one of the command decoders;
wherein the refresh controller is coupled to the private memory banks, and configured to, for each private memory bank, apply a refresh command only from an associated command decoder.

10. The multi-port memory system of claim 1, wherein the refresh commands include at least one of periodic refresh commands and burst refresh commands.

11. A multi-port memory system comprising:
a plurality of input buffers, each input buffer configured to receive command signals from a corresponding processor;
a plurality of command decoders, each command decoder coupled to a corresponding input buffer and configured to decode a refresh command from the command signals received by the corresponding input buffer;
a shared memory bank;
a refresh controller coupled to the command decoders and configured to receive the refresh commands from the command decoders and selectively apply the refresh commands to the shared memory bank; and
a comparator coupled to the refresh controller and the input buffers, and configured to compare the plurality of command signals with a setting to generate a comparison result;
wherein:
the refresh controller is configured to selectively apply a refresh command to the shared memory bank in response to the comparison result; and
the comparator is further configured to, for each command signal, compare a chip select signal of the command signal with a mode register code to generate the comparison result.

12. The multi-port memory system of claim 11, wherein the refresh controller is configured to apply refresh commands only associated with a chip select signal matching the mode register code.

* * * * *